United States Patent
Chu et al.

(10) Patent No.: US 9,130,114 B2
(45) Date of Patent: Sep. 8, 2015

(54) VERTICAL LIGHT EMITTING DIODE (VLED) DICE HAVING CONFINEMENT LAYERS WITH ROUGHENED SURFACES AND METHODS OF FABRICATION

(71) Applicant: SemiLEDS Optoelectronics Co., Ltd., Chu-Nan (TW)

(72) Inventors: Chen-Fu Chu, Hsinchu (TW); Hao-Chung Cheng, Pingtung County (TW); Feng-Hsu Fan, New Taipei (TW); Wen-Huang Liu, Hsinchu County (TW); Chao-Chen Cheng, Hsinchu (TW); David Trung Doan, Hsinchu County (TW); Yang Po Wen, Miaoli County (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 124 days.

(21) Appl. No.: 13/895,421

(22) Filed: May 16, 2013

(65) Prior Publication Data
US 2014/0339496 A1    Nov. 20, 2014

Related U.S. Application Data

(60) Continuation-in-part of application No. 12/986,946, filed on Jan. 7, 2011, now Pat. No. 8,466,479, which is a division of application No. 11/956,962, filed on Dec. 14, 2007, now Pat. No. 7,897,420, which is a
(Continued)

(51) Int. Cl.
| | |
|---|---|
| *H01L 33/22* | (2010.01) |
| *H01L 33/06* | (2010.01) |
| *H01L 33/04* | (2010.01) |
| *H01L 33/00* | (2010.01) |

(52) U.S. Cl.
CPC ............ *H01L 33/22* (2013.01); *H01L 33/0079* (2013.01); *H01L 33/06* (2013.01); *H01L 33/007* (2013.01); *H01L 33/0095* (2013.01); *H01L 33/04* (2013.01); *H01L 2924/12041* (2013.01)

(58) Field of Classification Search
CPC ......... H01L 33/22; H01L 33/06; H01L 33/07; H01L 2924/12041
See application file for complete search history.

(56) References Cited

U.S. PATENT DOCUMENTS

| | | | |
|---|---|---|---|
| 3,954,534 A | 5/1976 | Scifres et al. | |
| 4,482,442 A | 11/1984 | Kohl et al. | |
| 5,448,107 A | 9/1995 | Osada et al. | |

(Continued)

OTHER PUBLICATIONS

I. Schnitzer et al.. "30% External Quantum Efficiency from Surface Textured, Thin-Film Light-Emitting Diodes", Appl. Phys. Letters, Oct. 1993, vol. 63 (16), pp. 1-3.
(Continued)

*Primary Examiner* — Thanh V Pham
(74) *Attorney, Agent, or Firm* — Stephen A. Gratton

(57) ABSTRACT

A vertical light emitting diode (VLED) die includes an epitaxial structure having a first-type confinement layer, an active layer on the first-type confinement layer configured as a multiple quantum well (MQW) configured to emit light, and a second-type confinement layer having a roughened surface. In a first embodiment, the roughened surface includes a pattern of holes with a depth (d) in a major surface thereof surrounded by a pattern of protuberances with a height (h) on the major surface. In a second embodiment, the roughened surface includes a pattern of primary protuberances surrounded by a pattern of secondary protuberances.

15 Claims, 4 Drawing Sheets

Related U.S. Application Data continuation-in-part of application No. 11/690,443, filed on Mar. 23, 2007, now Pat. No. 7,524,686, which is a continuation-in-part of application No. 11/618,468, filed on Dec. 29, 2006, now Pat. No. 7,563,625, which is a continuation-in-part of application No. 11/032,880, filed on Jan. 11, 2005, now Pat. No. 7,186,580.

(56) References Cited

U.S. PATENT DOCUMENTS

| | | | |
|---|---|---|---|
| 5,779,924 A * | 7/1998 | Krames et al. | 216/24 |
| 5,793,062 A | 8/1998 | Kish, Jr. et al. | |
| 5,801,404 A | 9/1998 | Kahen et al. | |
| 6,023,413 A | 2/2000 | Umezawa | |
| 6,071,795 A | 6/2000 | Cheung et al. | |
| 6,161,910 A | 12/2000 | Reisenauer et al. | |
| 6,221,683 B1 | 4/2001 | Nirschl et al. | |
| 6,277,665 B1 | 8/2001 | Ma et al. | |
| 6,429,460 B1 | 8/2002 | Chen et al. | |
| 6,455,930 B1 | 9/2002 | Palanisamy et al. | |
| 6,535,385 B2 | 3/2003 | Lee | |
| 6,561,261 B2 | 5/2003 | Wagner | |
| 6,614,172 B2 | 9/2003 | Chiu et al. | |
| 6,649,440 B1 | 11/2003 | Krames et al. | |
| 6,658,041 B2 | 12/2003 | Uebbing | |
| 6,713,862 B2 | 3/2004 | Palanisamy et al. | |
| 6,744,071 B2 | 6/2004 | Sano et al. | |
| 6,770,542 B2 | 8/2004 | Plossi et al. | |
| 6,791,117 B2 * | 9/2004 | Yoshitake et al. | 257/94 |
| 6,800,500 B2 | 10/2004 | Coman et al. | |
| 6,821,804 B2 | 11/2004 | Mack et al. | |
| 6,828,529 B1 | 12/2004 | Wu | |
| 7,026,659 B2 | 4/2006 | Slater et al. | |
| 7,123,796 B2 | 10/2006 | Stecki et al. | |
| 7,186,580 B2 | 3/2007 | Tran et al. | |
| 7,473,936 B2 | 1/2009 | Tran et al. | |
| 7,524,686 B2 | 4/2009 | Chu et al. | |
| 7,563,625 B2 | 7/2009 | Tran et al. | |
| 7,629,195 B2 | 12/2009 | Tran et al. | |
| 7,897,420 B2 | 3/2011 | Chu et al. | |
| 2002/0014629 A1 * | 2/2002 | Shibata et al. | 257/79 |
| 2002/0097962 A1 | 7/2002 | Yoshimura et al. | |
| 2003/0178626 A1 | 9/2003 | Sugiyama et al. | |
| 2004/0134788 A1 | 7/2004 | Cohen et al. | |
| 2004/0135158 A1 | 7/2004 | Hon | |
| 2004/0245535 A1 | 12/2004 | D'Evelyn et al. | |
| 2004/0245543 A1 | 12/2004 | Yoo | |
| 2006/0154391 A1 | 7/2006 | Tran et al. | |
| 2008/0142814 A1 | 6/2008 | Chu et al. | |
| 2011/0101400 A1 | 5/2011 | Chu et al. | |

OTHER PUBLICATIONS

Lee et al. "Effect of Electrical Annealing of the Luminous Efficiency of Thermally Annealed Polymer Light-Emitting Diodes." Applied Physics Letters. Nov. 20, 2000, vol. 77(21); pp. 1-3.

International Application No. PCT/US 07/88792, Written Opinion and Search Report, Jun. 2, 2008, pp. 1-10.

International Application No. PCT/US 07/88300, Written Opinion and Search Report, May 22, 2008, pp. 1-10.

Notice of Allowance, U.S. Appl. No. 12/986,946, Feb. 20, 2013, pp. 1-7.

Non-Final Office Action, U.S. Appl. No. 12/986,946, Oct. 12, 2012, pp. 1-8.

Final Office Action, U.S. Appl. No. 12/986,946, Apr. 4, 2012, pp. 1-5.

Non-Final Office Action, U.S. Appl. No. 12/986,946, Jan. 9, 2012, pp. 1-5.

Advisory Action, U.S. Appl. No. 12/986,946, Oct. 19, 2012, pp. 1-3.

Final Office Action, U.S. Appl. No. 12/986,946, Aug. 12, 2011, pp. 1-5.

Non-Final Office Action, U.S. Appl. No. 12/986,946, Apr. 11, 2011, pp. 1-4.

* cited by examiner

VERTICAL LIGHT EMITTING DIODE (VLED) DICE HAVING CONFINEMENT LAYERS WITH ROUGHENED SURFACES AND METHODS OF FABRICATION

CROSS REFERENCE TO RELATED APPLICATIONS

This application is a continuation-in-part of Ser. No. 12/986,946, filed Jun. 7, 2011, which is a division of Ser. No. 11/956,962, filed Dec. 14, 2007, U.S. Pat. No. 7,897,420 B2, which is a continuation-in-part of Ser. No. 11/690,443, filed Mar. 23, 2007, U.S. Pat. No. 7,524,686 B2, which is a continuation-in-part of Ser. No. 11/618,468, filed Dec. 29, 2006, U.S. Pat. No. 7,563,625 B2, which is a continuation-in-part of Ser. No. 11/032,880, filed Jan. 11, 2005, U.S. Pat. No. 7,186,580 B2, all of which are incorporated herein by reference.

BACKGROUND

This disclosure relates generally to optoelectronic components and more particularly to vertical light emitting diode (VLED) dice, and to methods for fabricating the vertical light emitting diode (VLED) dice.

One type of light emitting diode (LED) die, known as a vertical light emitting diode (VLED) die, includes an epitaxial structure made of a compound semiconductor material, such as GaN, AlN or InN formed on a carrier substrate. Following the fabrication process, the epitaxial structure is separated from the carrier substrate. The epitaxial structure can include a p-type confinement layer, an n-type confinement layer, and an active layer (multiple quantum well (MQW) layer) between the confinement layers configured to emit light. In the epitaxial structure, the n-type confinement layer can comprise multiple n-type layers, and can also include one or more buffer layers, such as a SiN layer for decreasing dislocation density.

One method for increasing the light extraction from a vertical light emitting diode (VLED) die is to roughen and texture the surface of the n-type confinement layer using a process such as photo-electrical chemical oxidation and etching. For example, processes for roughening the n-type confinement layer are disclosed in the US patents cited in the above "Cross Reference To Related Applications", commonly assigned to SemiLEDs Optoelectronics Company Ltd. of Chu-Nan Taiwan ROC.

The present disclosure is directed to vertical light emitting diode (VLED) dice having roughened confinement layers for increased light extraction. The present disclosure is also directed to methods for fabricating vertical light emitting diode (VLED) dice with roughened confinement layers.

SUMMARY

A vertical light emitting diode (VLED) die comprises an epitaxial structure that includes a first-type confinement layer, an active layer on the first-type confinement layer configured as a multiple quantum well (MQW) configured to emit light, and a second-type confinement layer having a roughened surface. In a first embodiment, the roughened surface includes a major surface having a pattern of holes with a depth (d) in the major surface surrounded by a pattern of protuberances with a height (h) on the major surface. In a second embodiment, the roughened surface includes a pattern of primary protuberances surrounded by a pattern of secondary protuberances. In the second embodiment, the primary protuberances can be larger in size and can have a larger height on the major surface than the secondary protuberances.

A method for fabricating vertical light emitting diode (VLED) dice includes the steps of: providing a carrier substrate; forming a first-type confinement layer on the carrier substrate; forming an active layer on the first-type confinement layer; forming a second-type confinement layer; removing the carrier substrate; and roughening an outer surface of the second-type confinement layer.

DETAILED DESCRIPTION

Figure 1A:
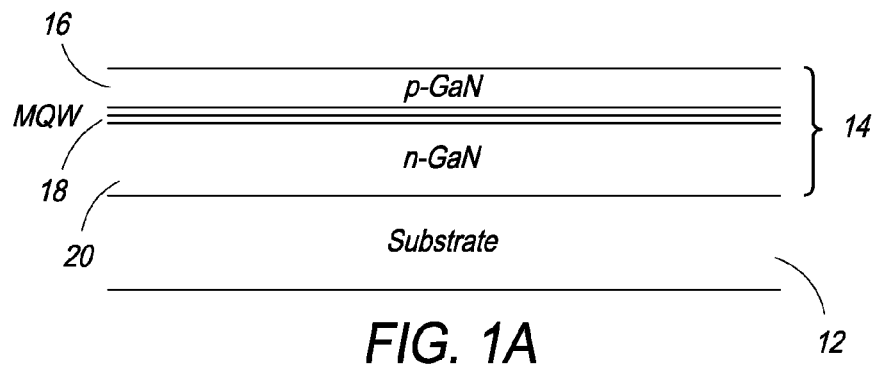
FIGS. 1A-1D illustrate steps in a method for fabricating vertical light emitting diode (VLED) dice having confinement layers with roughened surfaces.

Referring to FIGS. 1A-1D, steps in a method for fabricating vertical light emitting diode (VLED) dice 10 are illustrated. Initially, as shown in FIG. 1A, a carrier substrate 12 can be provided. The carrier substrate 12 can be in the form of a wafer comprised of a suitable material, such as sapphire, silicon carbide (SiC), silicon (Si), germanium (Ge), zinc oxide (ZnO), gallium nitride (GaN), aluminum nitride (AlN), zinc selenium (ZnSe) and gallium arsenide (GaAs).

As also shown in FIG. 1A, a multi layer epitaxial structure 14 can be formed on the carrier substrate 12. The epitaxial structure 14 includes a p-type confinement layer 16 (first-type confinement layer in the claims), an active layer 18 on the p-type confinement layer 16 configured to emit light (designated MQW in FIGS. 1A-1D), and an n-type confinement layer 20 (second-type confinement layer in the claims) on the active layer 18. All of these layers can be fabricated using a suitable deposition process such as vapor phase epitaxy (VPE), metal organic chemical vapor deposition (MOCVD), molecular beam epitaxy (MBE) or liquid phase epitaxy (LPE). In the illustrative embodiment, the p-type confinement layer 16 comprises p-GaN and the n-type layer 20 comprises n-GaN. Rather than GaN, the p-type confinement layer 16 and the n-type layers 20 can comprise various other compound semiconductor materials, such as AlGaN, InGaN, and AlInGaN. The active layer 18 can be formed of suitable materials such as an InGaN layer sandwiched between two layers of a material with a wider bandgap such as GaN.

Figure 1B:
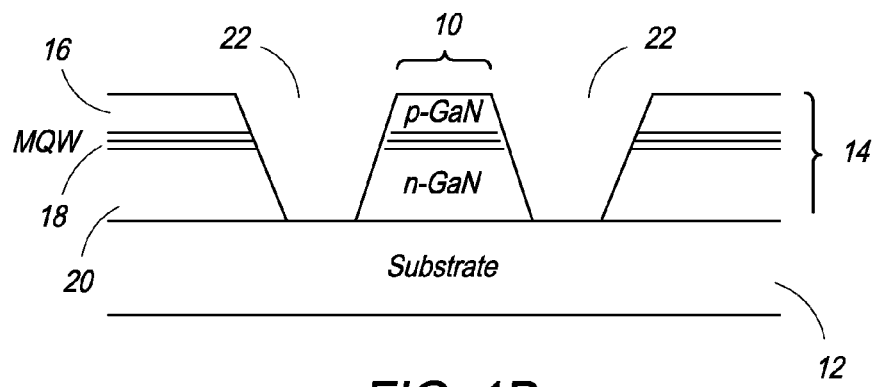

Next as shown in FIG. 1B, a suitable process can be used to form trenches 22 through the epitaxial structure 14 that can endpoint on the carrier substrate 12 as shown, or alternately that can extend a short distance into the carrier substrate 12. In addition, prior to forming the trenches 22, other elements such as reflector layers (not shown) and bases (not shown) can be formed as required. The trenches 22 can be formed in a criss-cross pattern similar to the streets between dice in a conventional semiconductor fabrication process, such that a plurality of defined dice 10 are formed. A suitable process for forming the trenches 22 comprises dry etching through a hard mask. Other suitable processes include laser cutting, saw cutting, diamond cutting, wet etching, dry etching and water jetting.

Figure 1C:
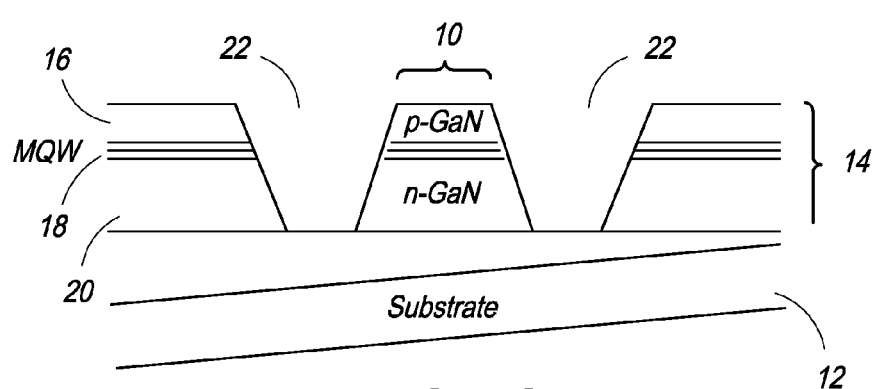

Next as shown in FIG. 1C, the carrier substrate 12 can be removed from the n-type confinement layer 20 using a suitable process such as a pulse laser irradiation process, etching, or chemical mechanical planarization (CMP).

Figure 1D:
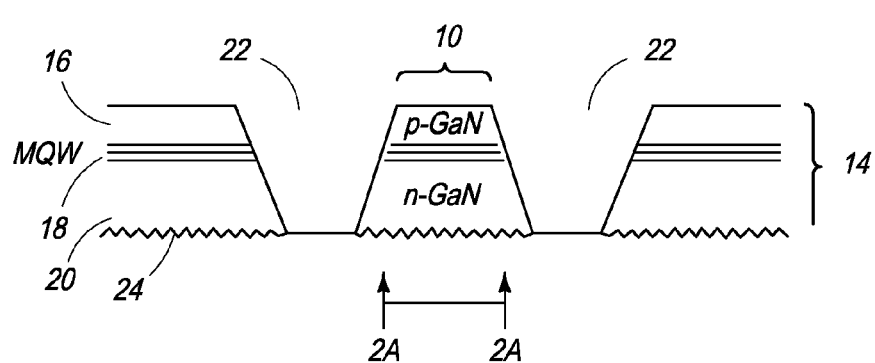

Next as shown in FIG. 1D, a roughened surface 24 can be formed on the outer surface of the n-type confinement layer 20 using a roughening (or texturing) process. One process for roughening the outer surfaces of the n-type confinement layer 20 combines photo-electrochemical oxidation and etching. This process is described in U.S. Pat. Nos. 7,186,580 B2; 7,473,936 B2; 7,524,686 B2; 7,563,625 B2 and 7,629,195 B2, which are incorporated herein by reference.

Figure 2A:
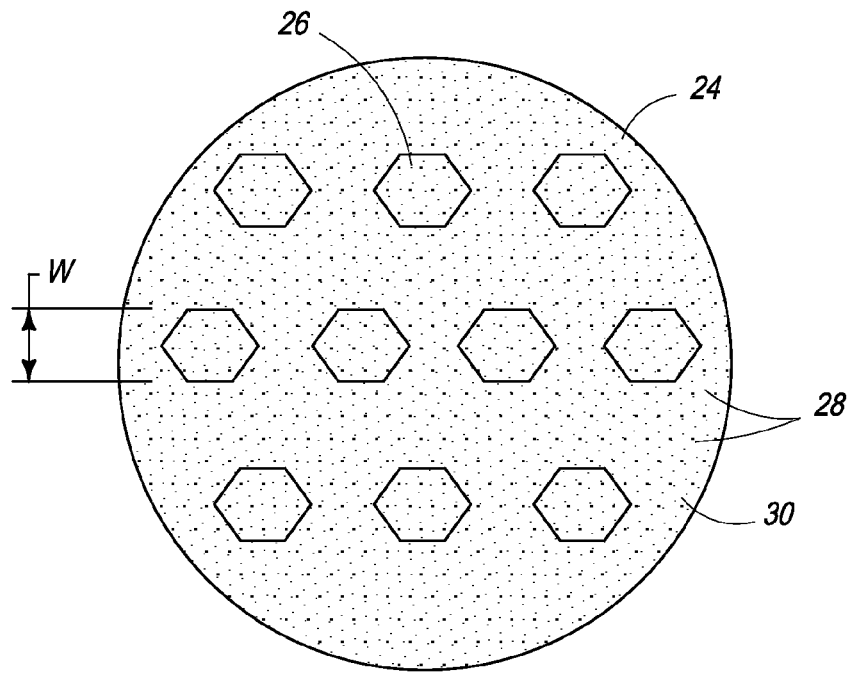
FIG. 2A is an enlarged schematic plan view taken along line 2A-2A of FIG. 1D illustrating a confinement layer on a vertical light emitting diode (VLED) die having a roughened surface with holes surrounded by protuberances.
Figure 2B:
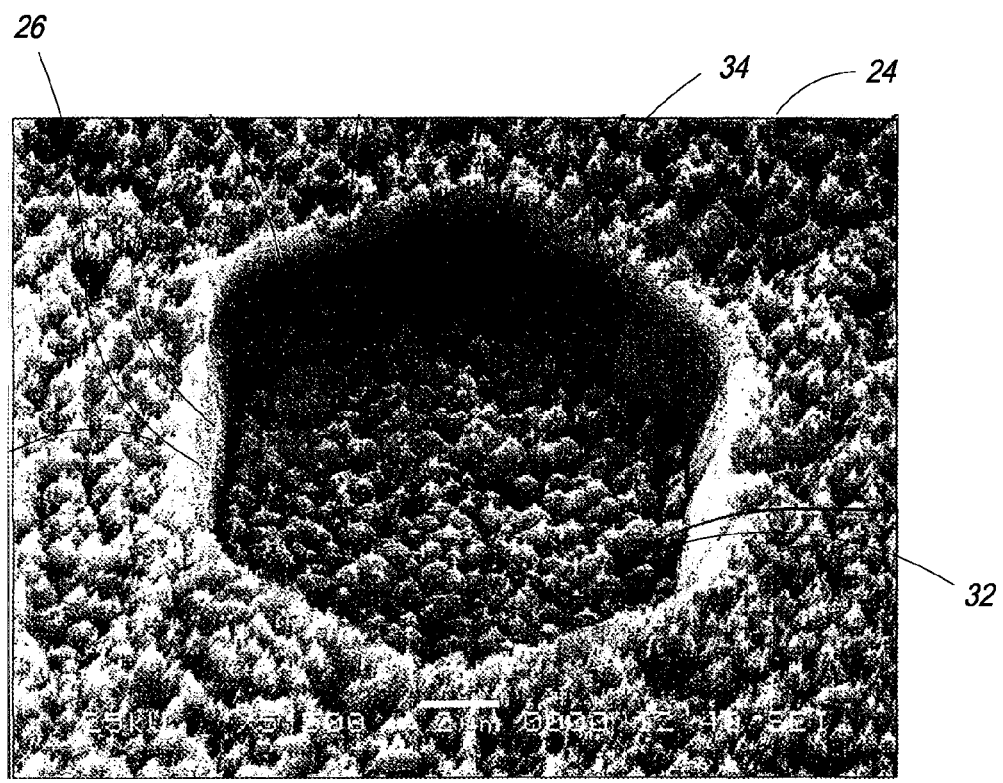
FIG. 2B is a SEM graph of the roughened surface of the confinement layer of the vertical light emitting diode (VLED) die shown in FIG. 2A.

The roughened surface 24 is illustrated schematically in FIG. 2A, and in a SEM graph in FIG. 2B. The roughened surface 24 includes a major surface 30 having a pattern of holes 26 with a depth (d) in the major surface 30 surrounded by a pattern of protuberances 28 with a height (h) on the major surface 30. As shown in FIG. 2B, the holes 26 can have a generally hexagonal peripheral shape with a width w, a roughened bottom surface 32 having additional protuberances 28, and smooth sidewalls 34 formed at an angle of about 90° with respect to the major surface 30. Rather than a hexagonal peripheral shape, the holes 26 can have other peripheral shapes such as circular, square, rectangular, oval or polygonal. The protuberances 28 can have a generally pyramidal, truncated pyramidal or ziggurat shape having sidewalls at an angle greater than 90° with respect to the major surface 30, as is consistent with etching of a crystalline semiconductor material. In addition, the dimensions of the holes 26 and of the protuberances 28 can be selected as required, with from one micron or less to several microns or more being representative. The geometrical shapes and dimensions of the holes 26 and of the protuberances 28 can be achieved using one or more masks, and a suitable process or processes such as wet etching, photoenhanced wet etching, dry etching, or photo-electrochemical oxidation and etching as described in the above cited patents. Further, these processes can include separate operations for forming the holes 26 and the protuberances 28. In general, the holes 26 and the protuberances 28 scatter light from the active layer 18 to achieve enhanced light extraction substantially as described in the previously cited patents. Although, the protuberances 28 are described as having a substantially uniform size and shape, the protuberances can also have different sizes and shapes. For example, as will be further described the protuberances 28 can include primary protuberances surrounded by a pattern of secondary protuberances.

Figure 3B:
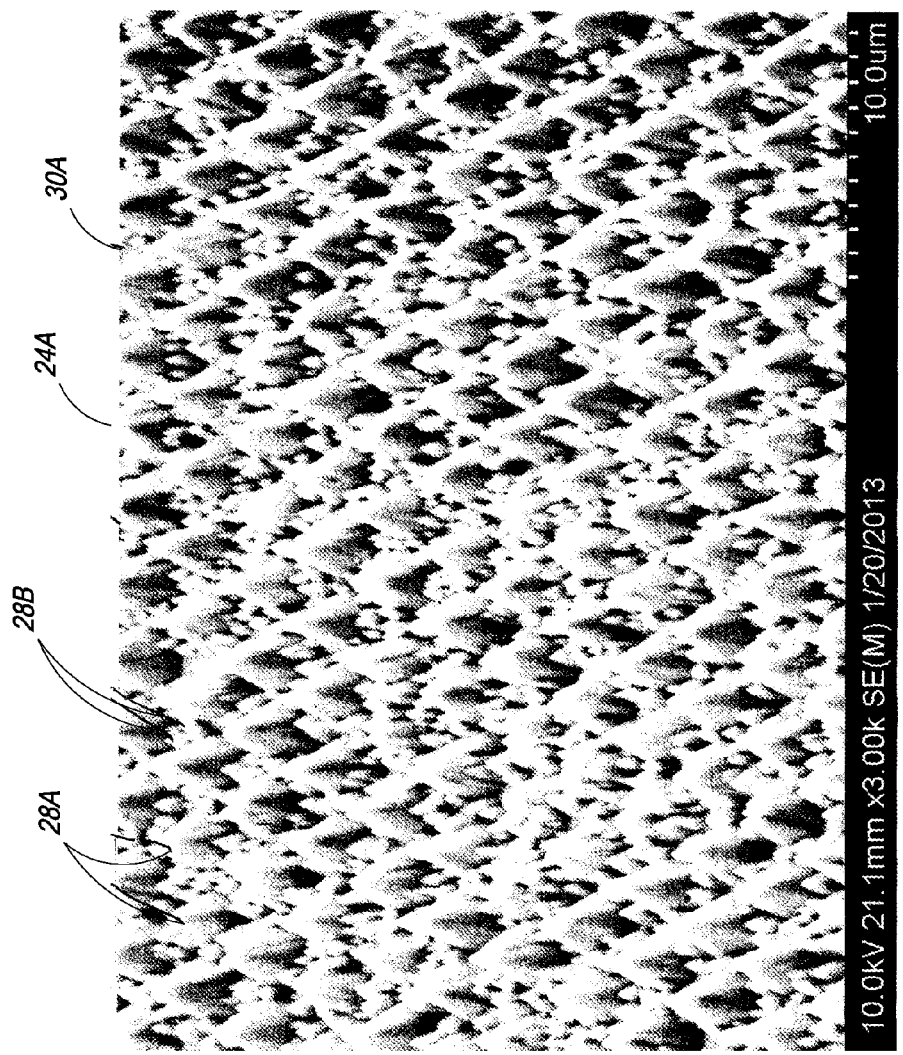
FIG. 3B is a SEM graph of the roughened surface of the confinement layer of the vertical light emitting diode (VLED) die shown in FIG. 3A.
Figure 3A:
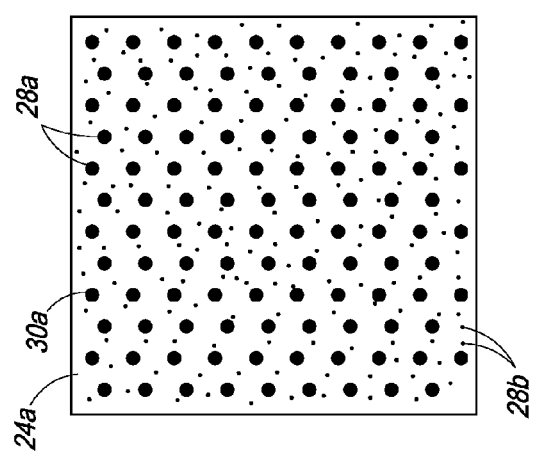
FIG. 3A is an enlarged schematic plan view equivalent to FIG. 2A illustrating a confinement layer comprising a primary pattern of protuberances surrounded by a secondary pattern of protuberances.

Referring to FIGS. 3A and 3B, an alternate embodiment roughened surface 24A includes a pattern of primary protuberances 28A surrounded by a pattern of secondary protuberances 28B. The protuberances 28A and 28B can have a generally pyramidal, truncated pyramidal or ziggurat shape consistent with etching of a crystalline semiconductor material. As shown in FIG. 3B, the primary protuberances are larger in size and have a larger height on the major surface 30A than the secondary protuberances 28B. The dimensions of the protuberances 28A and 28B can be selected as required, with from one micron or less to several microns or more being representative. The geometrical shapes of the protuberances 28 can be achieved using one or more masks, and a suitable process or processes such as wet etching, photoenhanced wet etching, dry etching, or photo-electrochemical oxidation and etching as described in the above cited patents. Further, these processes can include separate operations for forming the primary protuberances 28A and the secondary protuberances 28B. In general, the protuberances 28A and 28B scatter light from the active layer 18 to achieve enhanced light extraction substantially as described in the previously cited patents. As another alternative, the alternate embodiment roughened surface 24A can include a pattern of holes 26 substantially as previously described and shown in FIGS. 2A and 2B.

Figure 4:
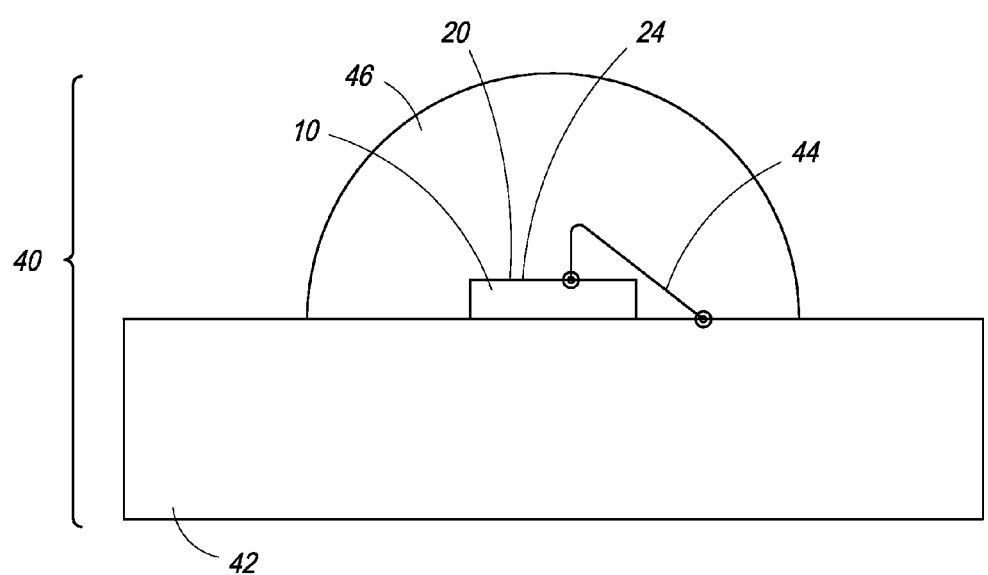
FIG. 4 is a schematic cross sectional view of a vertical light emitting diode (VLED) package constructed with the vertical light emitting diode (VLED) die.

Referring to FIG. 4, a vertical light emitting diode (VLED) package 40 constructed using the vertical light emitting diode (VLED) die 10 is illustrated. The vertical light emitting diode (VLED) package 40 includes a substrate 42; at least one vertical light emitting diode (VLED) die 10 mounted to the substrate 42; a wire 44 bonded to the vertical light emitting diode (VLED) die 10 and to the substrate 42; and a transparent dome 46 configured as a lens encapsulating the vertical light emitting diode (VLED) die 10. In addition, the roughened surface 24 of the n-type confinement layer 20 of the vertical light emitting diode (VLED) die 10 functions to improve light extraction.

Thus the disclosure describes an improved vertical light emitting diode (VLED) die having an n-type confinement layer having a roughened surface, and a method for fabricating the vertical light emitting diode (VLED) die. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A vertical light emitting diode (VLED) die comprising:
a first-type confinement layer;
an active layer on the first-type confinement layer comprising a multiple quantum well (MQW) configured to emit light; and
a second-type confinement layer comprising a roughened surface having a major surface, the roughened surface comprising a hole pattern and a separate protuberance pattern surrounding the hole pattern, the hole pattern comprising a plurality of holes in the major surface, each hole having a first geometrical shape and a depth (d) in the major surface, the protuberance pattern comprising a plurality of protuberances on the major surface, each protuberance having a second geometrical shape and a height (h) on the major surface.

2. The vertical light emitting diode (VLED) die of claim 1 wherein each hole includes a bottom surface having a plurality of second protuberances.

3. The vertical light emitting diode (VLED) die of claim 1 wherein each hole has a generally hexagonal peripheral shape.

4. The vertical light emitting diode (VLED) die of claim 1 wherein each hole has a shape selected from the group consisting of circular, square, rectangular, oval and polygonal.

5. The vertical light emitting diode (VLED) die of claim 1 wherein each protuberance has a generally pyramidal, truncated pyramidal or ziggurat shape.

6. The vertical light emitting diode (VLED) die of claim 1 wherein the protuberances have sidewalls at an angle greater than 90° with respect to the major surface.

7. The vertical light emitting diode (VLED) die of claim 1 wherein the protuberances include a plurality of first protuberances having a first height and a plurality of second protuberances having a second height.

8. The vertical light emitting diode (VLED) die of claim 1 wherein the first-type confinement layer comprises a p-type semiconductor layer and the second-type confinement layer comprises an n-type semiconductor layer.

9. A vertical light emitting diode (VLED) die comprising:
a first-type confinement layer;
an active layer on the first-type confinement layer comprising a multiple quantum well (MQW) configured to emit light; and
a second-type confinement layer comprising a roughened surface having a major surface, the roughened surface comprising a hole pattern and a separate protuberance pattern surrounding the hole pattern, the hole pattern comprising a plurality of holes in the major surface, each hole having a selected peripheral shape and a depth (d) in the major surface, the protuberance pattern comprising a plurality of protuberances on the major surface, each protuberance having a generally pyramidal shape and a height (h) on the major surface.

10. The vertical light emitting diode (VLED) die of claim 9 wherein the selected peripheral shape comprises hexagonal.

11. The vertical light emitting diode (VLED) die of claim 9 wherein the selected peripheral shape comprises circular.

12. The vertical light emitting diode (VLED) die of claim 9 wherein the selected peripheral shape comprises polygonal.

13. The vertical light emitting diode (VLED) die of claim 9 wherein the selected peripheral shape comprises oval.

14. A vertical light emitting diode (VLED) die comprising:
a first-type confinement layer;
an active layer on the first-type confinement layer comprising a multiple quantum well (MQW) configured to emit light; and
a second-type confinement layer comprising a roughened surface having a major surface, the roughened surface comprising a hole pattern and a separate protuberance pattern surrounding the hole pattern, the hole pattern comprising a plurality of holes in the major surface, each hole having a selected peripheral shape, sidewalls and a bottom surface to a depth (d) in the major surface, the protuberance pattern comprising a plurality of protuberances on the major surface, each protuberance having a generally pyramidal shape and a height (h) on the major surface.

15. The vertical light emitting diode (VLED) die of claim 14 wherein each hole includes a plurality of second protuberances on the bottom surface.

\* \* \* \* \*